United States Patent
Machida et al.

(10) Patent No.: US 7,622,920 B2
(45) Date of Patent: Nov. 24, 2009

(54) MAGNETIC RESONANCE IMAGING APPARATUS CAPABLE OF AUTOMATICALLY DETERMINING RF COIL POSITIONS

(75) Inventors: Yoshio Machida, Nasushiobara (JP); Nobuyasu Ichinose, Otawara (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 0 days.

(21) Appl. No.: 11/822,057

(22) Filed: Jul. 2, 2007

(65) Prior Publication Data

US 2008/0007263 A1 Jan. 10, 2008

(30) Foreign Application Priority Data

Jul. 6, 2006 (JP) .............................. 2006-187145

(51) Int. Cl. *G01V 3/00* (2006.01)
(52) U.S. Cl. ..................................................... 324/307
(58) Field of Classification Search ......... 324/300–322; 600/410–435
See application file for complete search history.

(56) References Cited

U.S. PATENT DOCUMENTS

| | | | | |
|---|---|---|---|---|
| 5,615,676 | A * | 4/1997 | Kohno ......................... | 600/410 |
| 5,868,674 | A * | 2/1999 | Glowinski et al. ........... | 600/410 |
| 5,936,406 | A * | 8/1999 | Potthast ....................... | 324/318 |
| 6,246,896 | B1 * | 6/2001 | Dumoulin et al. ........... | 600/411 |
| 6,275,721 | B1 * | 8/2001 | Darrow et al. ............... | 600/410 |
| 6,289,233 | B1 * | 9/2001 | Dumoulin et al. ........... | 600/410 |
| 6,492,814 | B1 * | 12/2002 | Watkins et al. .............. | 324/318 |
| 6,661,227 | B2 * | 12/2003 | Eggers et al. ................ | 324/307 |
| 6,687,530 | B2 * | 2/2004 | Dumoulin .................... | 600/423 |
| 6,724,923 | B2 * | 4/2004 | Ma et al. ...................... | 382/131 |
| 6,794,872 | B2 * | 9/2004 | Meyer et al. ................. | 324/318 |
| 6,882,150 | B2 * | 4/2005 | Jenniskens et al. .......... | 324/309 |
| 6,961,455 | B2 * | 11/2005 | Ma et al. ...................... | 382/131 |
| 6,990,223 | B2 * | 1/2006 | Ma et al. ...................... | 382/131 |
| 7,102,351 | B2 | 9/2006 | Machida et al. | |
| 7,141,976 | B2 * | 11/2006 | Campagna ................... | 324/318 |
| 7,330,030 | B2 * | 2/2008 | Nakabayashi ............... | 324/318 |

(Continued)

FOREIGN PATENT DOCUMENTS

JP 05-041256 6/1993

(Continued)

OTHER PUBLICATIONS

Reykowski et al.: "Mode Matrix—A Generalized Signal Combiner for Parallel Imaging Arrays," Proc. Intl. Soc. Mag. Reson. Med. 11 (2004) p. 1587.

*Primary Examiner*—Brij B. Shrivastav
*Assistant Examiner*—Dixomara Vargas
(74) *Attorney, Agent, or Firm*—Nixon & Vanderhye, PC (57) ABSTRACT

A magnetic resonance imaging apparatus includes an array coil in which a plurality of element coils are arranged to receive magnetic resonance signals from a subject, a calculation unit which calculates projection data for the element coils regarding an arrangement direction of the plurality of element coils on the basis of the plurality of magnetic resonance signals received by the plurality of element coils, and a determination unit which determines the positions of the plurality of element coils or the position of the array coil on the basis of the projection data for the plurality of element coils.

29 Claims, 7 Drawing Sheets

U.S. PATENT DOCUMENTS

| | | |
|---|---|---|
| 7,391,214 B2 * | 6/2008 | Adachi .................... 324/318 |
| 2003/0120146 A1 * | 6/2003 | Dumoulin ................ 600/410 |
| 2005/0151538 A1 | 7/2005 | Ichinose |
| 2006/0106299 A1 | 5/2006 | Uchizono |
| 2007/0219443 A1 * | 9/2007 | Ehnholm et al. ........... 600/414 |
| 2008/0015430 A1 * | 1/2008 | Takamori ................. 600/415 |

FOREIGN PATENT DOCUMENTS

| | | |
|---|---|---|
| JP | 07-124135 | 5/1995 |

* cited by examiner

| | ch1 | ch2 | ch3 | ch4 |
|---|---|---|---|---|
| Peak | 1336 | 722 | 556 | 687 |
| Peak half-width | 668 | 361 | 278 | 343.5 |
| Half-width | 96 | 113 | 152 | 94 |
| Central coordinates of coil | 0 | 109 | 239 | 331 |
| | | | | |
| Distance between channels | | ch1-ch2 | ch2-ch3 | ch3-ch4 |
| | | 109 | 130 | 92 |

| δ | Signal strength |
|---|---|
| 0 | 1.00 |
| 0.1 | 0.98 |
| 0.2 | 0.94 |
| 0.3 | 0.86 |
| 0.4 | 0.76 |
| 0.5 | 0.64 |
| 0.6 | 0.50 |
| 0.7 | 0.37 |
| 0.8 | 0.23 |
| 0.9 | 0.11 |
| 1 | 0.00 |

MAGNETIC RESONANCE IMAGING APPARATUS CAPABLE OF AUTOMATICALLY DETERMINING RF COIL POSITIONS

CROSS-REFERENCE TO RELATED APPLICATIONS

This application is based upon and claims the benefit of priority from prior Japanese Patent Application No. 2006-187145, filed Jul. 6, 2006, the entire contents of which are incorporated herein by reference.

BACKGROUND OF THE INVENTION

1. Field of the Invention

The present invention relates to a magnetic resonance imaging apparatus which receives a magnetic resonance signal using an array coil formed by arranging a plurality of element coils.

2. Description of the Related Art

There is known a method of efficiently performing parallel imaging using an array coil formed by arranging a plurality of element coils.

In this parallel imaging, performance can be enhanced by considering the position of the array coil. For example, in A. Reykowski, M. Blasche, "Mode Matrix—A Generalized Signal Combiner For Parallel Imaging Arrays," ISMRM 2004, p. 1587, there is disclosed a technique for using "Mode Matrix" to efficiently perform the parallel imaging using a large number of array coils for general imaging.

A known technique for finding the position of a reception coil is disclosed in Jpn. Pat. Appln. KOKAI Publication No. 7-124135. Jpn. Pat. Appln. KOKAI Publication No. 7-124135 discloses the technique for attaching a marker to a central part of the reception coil, collecting a nuclear magnetic resonance (NMR) signal from the marker, and finding the position of the marker from the collected NMR signal. Moreover, a method which provides a special mechanism for detecting the position of a coil is proposed by Jpn. Pat. Appln. KOKOKU Publication No. 5-41256.

According to the technique of Jpn. Pat. Appln. KOKAI Publication No. 7-124135, the position of the reception coil can be accurately found. However, the position of the reception coil having no marker attached thereto can not be detected. Further, the method in Jpn. Pat. Appln. KOKAI Publication No. 7-124135 is mechanically complicated, and it is difficult to apply this method to the detection of the positions of a larger number of coils.

BRIEF SUMMARY

Under such circumstances, it has been desired to be able to accurately determine the position of a coil unit which is not equipped with a system for position detection such as a marker or the positions of a plurality of element coils contained in such a coil unit.

According to a first aspect of the present invention, there is provided a magnetic resonance imaging apparatus comprising: an array coil in which a plurality of element coils are arranged to receive magnetic resonance signals from a subject; a calculation unit which calculates projection data for the element coils regarding an arrangement direction of the plurality of element coils on the basis of the plurality of magnetic resonance signals received by the plurality of element coils; and a determination unit which determines the positions of the plurality of element coils or the position of the array coil on the basis of the projection data for the plurality of element coils.

According to a second aspect of the present invention, there is provided a magnetic resonance imaging apparatus comprising: an array coil in which a plurality of element coils are arranged to receive magnetic resonance signals from a subject; a calculation unit which calculates projection data for the element coils regarding an arrangement direction of the plurality of element coils on the basis of the plurality of magnetic resonance signals received by the plurality of element coils; and a determination unit which determines the positions of the plurality of element coils or the position of the array coil on the basis of the projection data for the plurality of element coils and known information regarding the arrangement of the plurality of element coils.

According to a third aspect of the present invention, there is provided a magnetic resonance imaging apparatus comprising: an array coil in which a plurality of element coils are arranged to receive magnetic resonance signals from a subject; a scan controller which applies gradient magnetic fields with twisters at different strengths in a multispin echo method, and, at the same time, performs a sequence of causing the plurality of element coils to receive the magnetic resonance signals under the application of the plurality of gradient magnetic fields at different strengths; a calculation unit which calculates projection data regarding the plurality of element coils on the basis of a particular magnetic resonance signal among the plurality of magnetic resonance signals received under the application of the plurality of gradient magnetic fields; and a determination unit which determines the positions of the plurality of element coils or the position of the array coil on the basis of the projection data for the plurality of element coils.

According to a fourth aspect of the present invention, there is provided a magnetic resonance imaging apparatus comprising: an array coil in which a plurality of element coils are arranged to receive magnetic resonance signals from a subject; a movement unit which moves the subject or the array coil; a scan controller which performs a sequence of causing the plurality of element coils to receive the magnetic resonance signals while moving the subject or the array coil by the movement unit; a calculation unit which calculates projection data for the element coils regarding an arrangement direction of the plurality of element coils on the basis of the plurality of magnetic resonance signals received by the plurality of element coils; and a determination unit which determines the positions of the plurality of element coils or the position of the array coil on the basis of the projection data for the plurality of element coils.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF EXEMPLARY EMBODIMENTS

An embodiment of the invention will be described with reference to the accompanying drawings.

Figure 1:
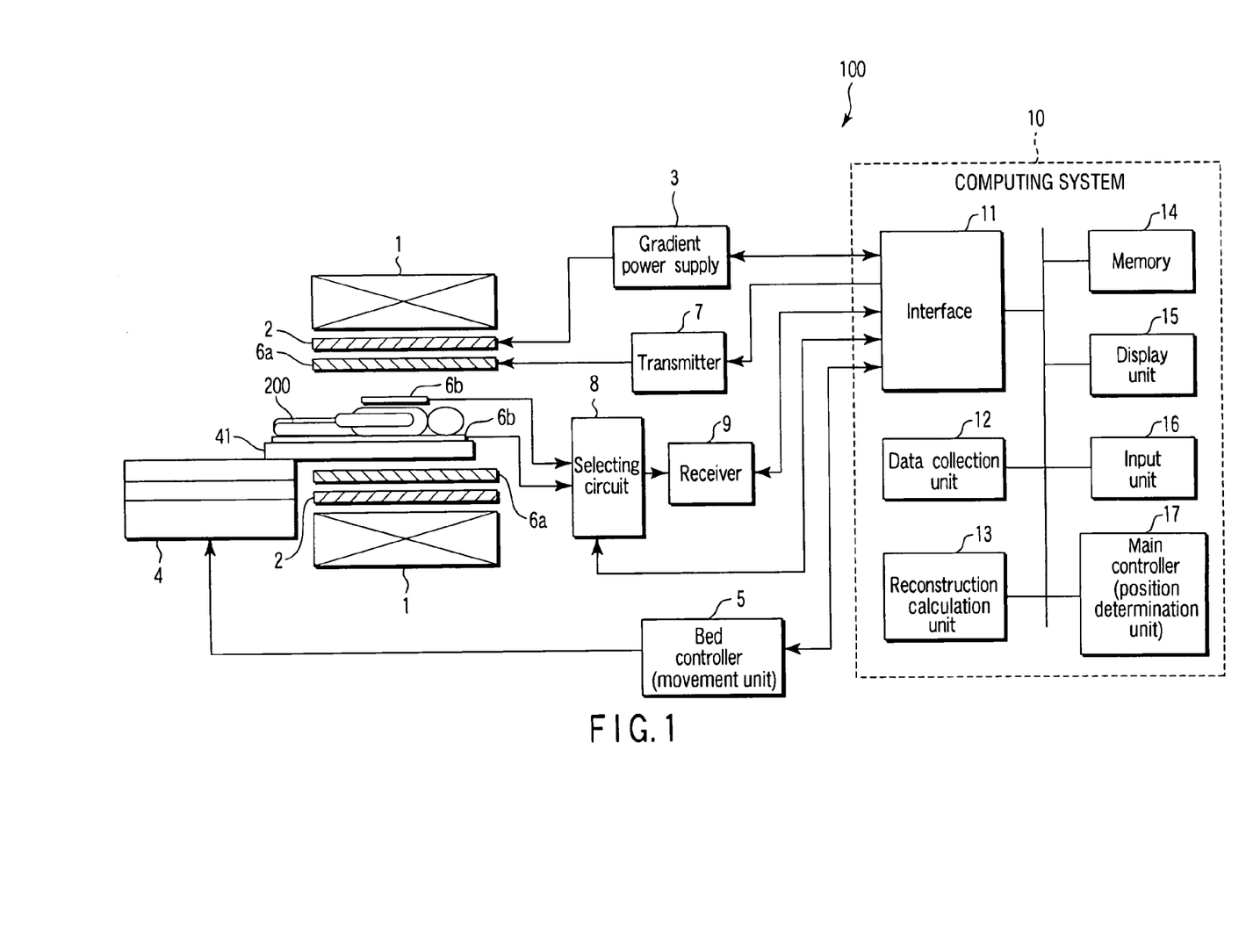
FIG. 1 shows a configuration of a magnetic resonance imaging (MRI) apparatus according to an embodiment of the present invention.

FIG. 1 is a block diagram illustrating the configuration of a magnetic resonance imaging (MRI) apparatus 100 according to the embodiment. The MRI apparatus 100 comprises a static field magnet 1, a gradient coil 2, a gradient power supply 3, a bed 4, a bed controller 5, RF coil units 6a and 6b, a transmitter 7, a selecting circuit 8, a receiver 9 and a computer system 10.

The static field magnet 1 is a hollow cylindrical member, and generates a uniform static magnetic field. The static field magnet 1 is, for example, a permanent magnet or a superconducting magnet.

The gradient coil 2 is also a hollow cylindrical member located inside the static field magnet 1. The gradient coil 2 is formed of three coils corresponding to three mutually perpendicular axes X, Y and Z. In the gradient coil 2, the three coils are individually supplied with a current from a gradient power supply 3, thereby generating gradient magnetic fields having their magnetic field intensities varied along the X-, Y- and Z-axes. Assume here that the Z-axis corresponds to, for example, the magnetization direction of the static magnetic field. The gradient magnetic fields along the X-, Y- and Z-axes correspond to, for example, a slice-selecting gradient magnetic field Gs, a phase-encoding gradient magnetic field Ge and a readout gradient magnetic field Gr, respectively. The slice-selecting gradient magnetic field Gs is used to determine an arbitrary imaging section. The phase-encoding gradient magnetic field Ge is used to change the phase of a magnetic resonance signal in accordance with its spatial position. The readout gradient magnetic field Gr is used to change the frequency of a magnetic resonance signal in accordance with its spatial position.

A subject 200 positioned on a top board 41 of the bed 4 is introduced into the cavity (imaging space) of the gradient coil 2 along with the bed 4. The top board 41 of the bed 4 is longitudinally and vertically driven by the bed controller 5. Normally, the bed 4 is positioned with its longitudinal direction set parallel to the axis of the static field magnet 1.

RF coil unit 6a is made by arranging one or a plurality of coils in a cylindrical case. RF coil unit 6a is located inside the gradient coil 2, and is used to generate a high-frequency magnetic field upon receiving a high-frequency pulse signal from the transmitter 7.

RF coil units 6b are mounted on the top board 41, built into the top board 41, or attached to the subject 200. When imaging is performed, they are introduced into the imaging space along with the subject 200. Various types of RF coil units 6b can be arbitrarily installed as the RF coil units 6b. In addition, the RF coil units 6b are not limited in number to two. A single RF coil unit may be used; alternatively, three or more RF coil units may be used. Each of RF coil units 6b includes at least one of element coil. The element coils of RF coil units 6b receive magnetic resonance signals radiating from the subject 200. Output signals from each element coil are supplied to the selecting circuit 8. It is to be noted that the number of element coils simultaneously connectable to the selecting circuit 8 is hereinafter indicated by m. The value of m is, for example, 128.

The transmitter 7 transmits a high-frequency pulse signal corresponding to the Larmor frequency to RF coil unit 6a.

The selecting circuit 8 selects magnetic resonance signals of arbitrary one to n channels from magnetic resonance signals of a maximum of m channels output from the RF coil units 6b. However, n is a positive number smaller than m, and is, for example, 32. The selecting circuit 8 supplies the selected magnetic resonance signals to the receiver 9. The computer system 10 designates which channel should be selected then.

The receiver 9 comprises n channels of processing systems which have amplifiers, phase detectors and analog/digital converters. The magnetic resonance signals of a maximum of n channels selected by the selecting circuit 8 are input to the n channels of processing systems. The amplifier unit amplifies magnetic resonance signals. The phase detection unit detects the phase of a magnetic resonance signal output from the amplifier unit. The analog/digital converter unit converts a signal output from the phase detection unit to a digital signal. The receiver 9 outputs digital signals produced from each processing system.

The computer system 10 includes an interface 11, a data collection unit 12, a reconstruction unit 13, a memory 14, a display unit 15, an input unit 16 and a main controller 17.

The interface 11 is connected to the gradient power supply 3, bed controller 5, transmitter 7, selecting circuit 8, receiver 9, etc. The interface 11 permits signals to be exchanged between the structural components described above and the computer system 10.

The data collection unit 12 collects digital signals output from the receiver 9. The data collection unit 12 stores the collected digital signals (i.e., magnetic resonance signal data) in the memory 14.

The reconstruction unit 13 performs post-processing such as Fourier transform on the magnetic resonance signal data stored in the memory 14, thereby acquiring spectrum data or image data corresponding to a desired nuclear spin in the subject 200. Further, the reconstruction unit 13 generates projection data for the arrangement direction of the element coils on the basis of magnetic resonance signal data regarding the magnetic resonance signal received by the particular element coils specified by the main controller 17.

The memory 14 stores the magnetic resonance signal data and spectrum data or image data of each subject.

The display unit 15 displays various information items, such as spectrum data, image data, etc., under the control of the controller 17. The display unit 15 may be a liquid crystal display, for example.

The input unit 16 receives various instructions or information items input by an operator. The input unit 16 may be a pointing device (such as a mouse or a track ball), a selective device (such as a mode switch), or an input device (such as a keyboard).

The main controller 17 has a CPU, memory, etc., and takes overall control of the MRI apparatus 100. When an array coil formed by arranging a plurality of element coils is used as the RF coil unit 6b, the main controller 17 is equipped with a function of controlling a scan for judging the position of the array coil (hereinafter, referred to as a position determination pre-scan) and a function of judging the position of the array coil on the basis of the result of the position determination pre-scan. The function of controlling the position determination pre-scan includes a function of selecting particular element coils to be used for the position determination pre-scan from the element coils contained in the array coil, and a function of setting conditions of the position determination pre-scan so that overflow is not caused by the reception in the particular element coils. The function of judging the position includes a function of estimating the positions of the particular element coils on the basis of the projection data obtained for the particular element coils, and a function of judging the position of the array coil on the basis of the positions estimated for the respective particular element coils and known information on the arrangement state of the plurality of the element coils. It is to be noted that the known information is typically a physical numerical value. The physical numerical value is typically the distance between the element coils.

Figure 2:
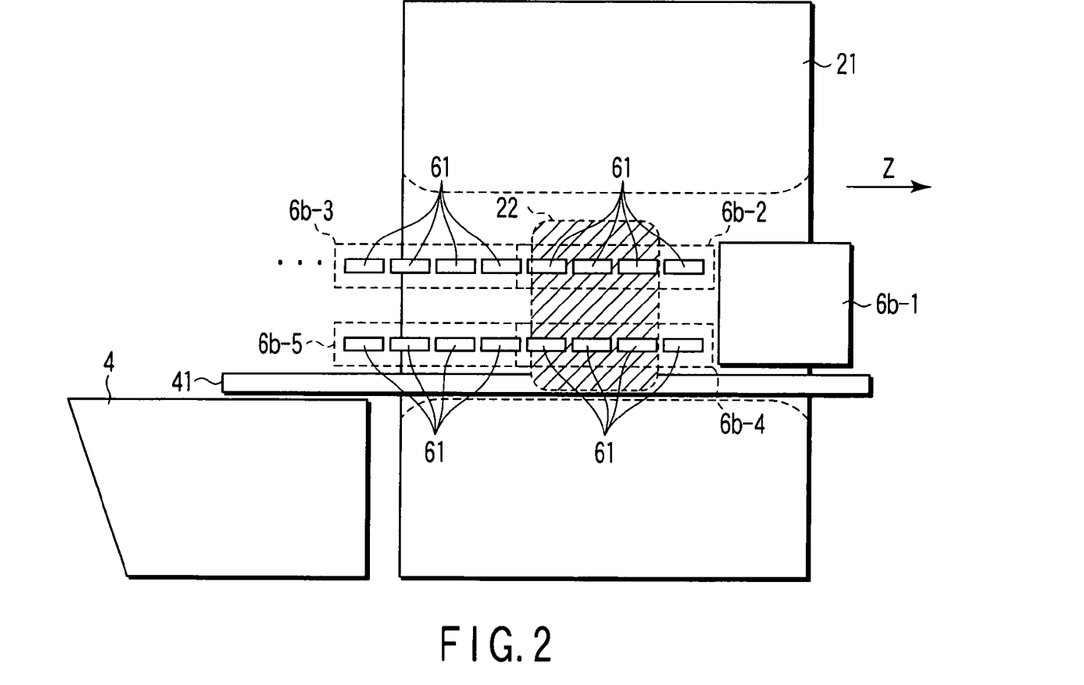
FIG. 2 is a diagram showing an example of how to install RF coil units in FIG. 1.

FIG. 2 is a diagram showing an example of how to install the RF coil units 6b. It is to be noted that the same signs are assigned to the same parts as those in FIG. 1 and these parts are not described in detail.

In the example shown in FIG. 2, the five RF coil units 6b are installed. It is to be noted that these RF coil units 6b are designated as RF coil units 6b-1, 6b-2, 6b-3, 6b-4 and 6b-5 when the RF coil units 6b have to be distinguished from each other. The RF coil unit 6b-1 is a head coil, and is arranged at an arbitrary position on the top board 41 so that the head of the subject 200 is introduced therein, or arranged on the head of the subject 200 and then positioned on the top board 41 together with the subject 200. The RF coil units 6b-2 and 6b-3 are abdominal coils, and are arranged on the front side of the body of the subject 200. The RF coil units 6b-4 and 6b-5 are vertebral coils, and are arranged at arbitrary positions on the top board 41 so that the subject 200 is positioned on their back on these coils, or arranged on the back of the subject 200 and then positioned on the top board 41 together with the subject 200. Thus, the positions of these RF coil units 6b at which they are arranged on the top board 41 are not fixed. Other RF coil units 6b optimized for regions such as the knees may be used.

Figure 3:
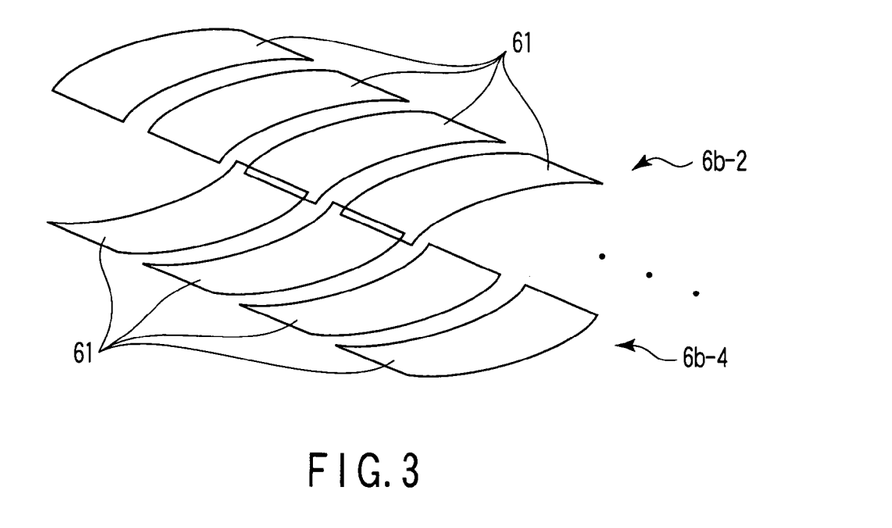
FIG. 3 is a perspective view showing how element coils in the RF coil units in FIG. 2 are arranged.

As shown in FIGS. 2 and 3, each of the RF coil units 6b-2, 6b-3, 6b-4 and 6b-5 is formed by arranging a plurality of (here, four) element coils 61 at equal intervals in one direction. As shown in FIG. 2, the RF coil units 6b-2, 6b-3, 6b-4 and 6b-5 are used such that the arrangement direction of the element coils 61 coincides with the Z-axis. It is to be noted that FIG. 3 is a perspective view showing how the element coils 61 in the RF coil units 6b-2 and 6b-3 are arranged.

The RF coil units 6b-2 and 6b-3 can be independently installed at arbitrary positions, or can be linked to each other by a mechanical link mechanism and thus installed at a given distance therebetween. This holds true with the RF coil units 6b-4 and 6b-5.

The element coils 61 may be formed by combining a plurality of more coils. There has been proposed a method called Mode Matrix which recombines and uses about three to four coils (refer to A. Reykowski, M. Blasche, "Mode Matrix—A Generalized Signal Combiner For Parallel Imaging Arrays," ISMRM 2004, p. 1587). The combining unit in this Mode Matrix can be used as in the element coils.

Now, a numeral 21 in FIG. 2 denotes a table which stores the static field magnet 1, the gradient coil 2 and the RF coil units 6a. An imaging use zone which is actually used for imaging is only part of an imaging space inside the table 21, as indicated by a numeral 22. The RF coil units 6b-2, 6b-3, 6b-4 and 6b-5 are larger than the imaging use zone 22, and some of the element coils 61 can only be positioned within the imaging use zone 22. In the example in FIG. 2, the second to fourth element coils 61 of each of the RF coil units 6b-2 and 6b-4 are positioned within the imaging use zone 22. That is, in the condition shown in FIG. 2, the element coils 61 positioned within the imaging use zone 22 are used for actual imaging. Thus, as the channels of the array coil increases, it is necessary to know the positions of the RF coil units or the positions of the element coils 61 to select the suitable element coils to be used for imaging.

(1) Judgment of the Positions of the Element Coils 61.

Therefore, when there are the RF coil units 6b whose positions on the top board 41 are not fixed, the MRI apparatus 100 determines the positions of the element coils 61 contained in the RF coil units 6b as described below. The determination of the positions has only to be targeted at the RF coil units 6b whose positions on the top board 41 are not fixed, and is not targeted at the types of RF coil units 6b such as the vertebral coils which are fixed to the top board 41.

Figure 4:
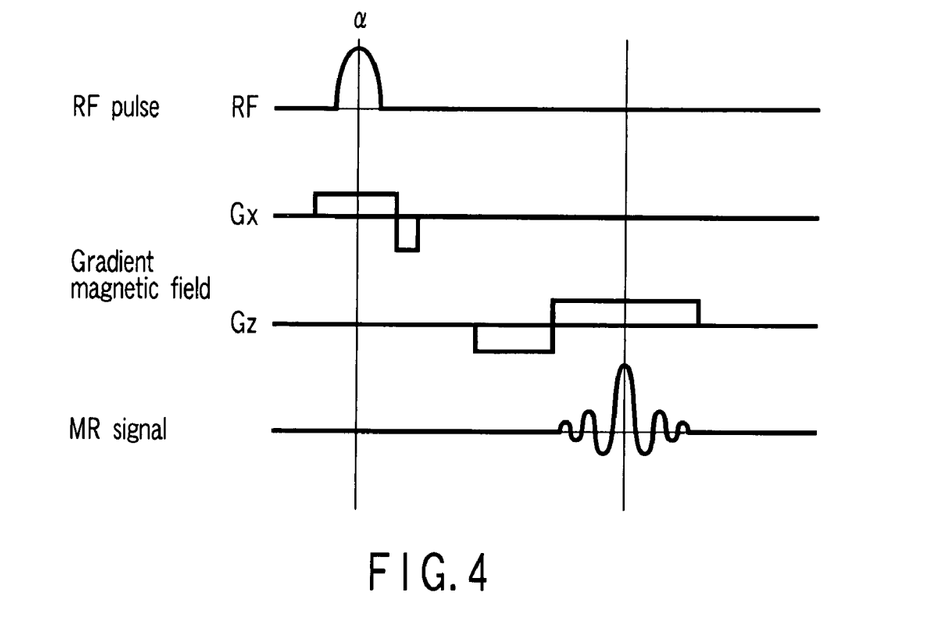
FIG. 4 is a diagram showing a basic pulse sequence in a position determination pre-scan.
Figure 5:
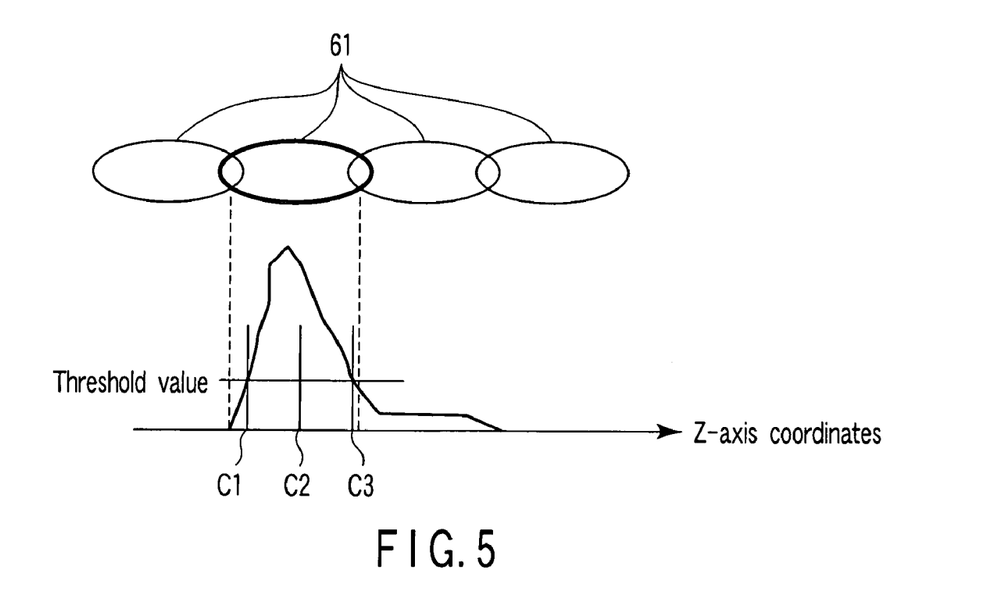
FIG. 5 is a diagram showing the principle of estimating central coordinates of the element coils from projection data.

The main controller 17 first executes the position determination pre-scan. The technology disclosed in U.S. Pat. No. 5,936,406 can be used for the position determination pre-scan. To be specific, in the position determination pre-scan, a gradient magnetic field is applied in the arrangement direction of the element coils 61 in the RF coil units 6b, that is, along the Z-axis by a sequence in FIG. 4 to obtain projection data for this direction. In this case, the projection data based on the magnetic resonance signals received by the element coils 61 located within the imaging use zone 22 indicates the rough positions of the element coils 61, for example, as shown in FIG. 5. Thus, the main controller 17 uses, for example, a predetermined threshold value to find coordinates of both ends C1 and C3. Further, the main controller 17 estimates coordinate C2 at the midpoint between the coordinates of both ends C1 and C3 to be central coordinates of the element coils 61.

It is to be noted that no magnetic resonance signal is output or only a small magnetic resonance signal is output from the element coils 61 located outside the imaging use zone 22. Thus, the main controller 17 ignores the signals output from such element coils 61, and only estimates the positions of the element coils 61 which have output significant signals. In the case of ignoring the signals output from the element coils 61, projection data based on these signals may not be generated, or the central coordinates may not be estimated on the basis of the projection data generated from these signals, or the central coordinates estimated for the element coils 61 which have output these signals may not be used to determine the positions of the element coils 61. Moreover, it is not necessary to estimate the positions of all the element coils 61 which have output the significant signals, and the positions of some of such element coils 61 alone may be estimated.

Figure 6:
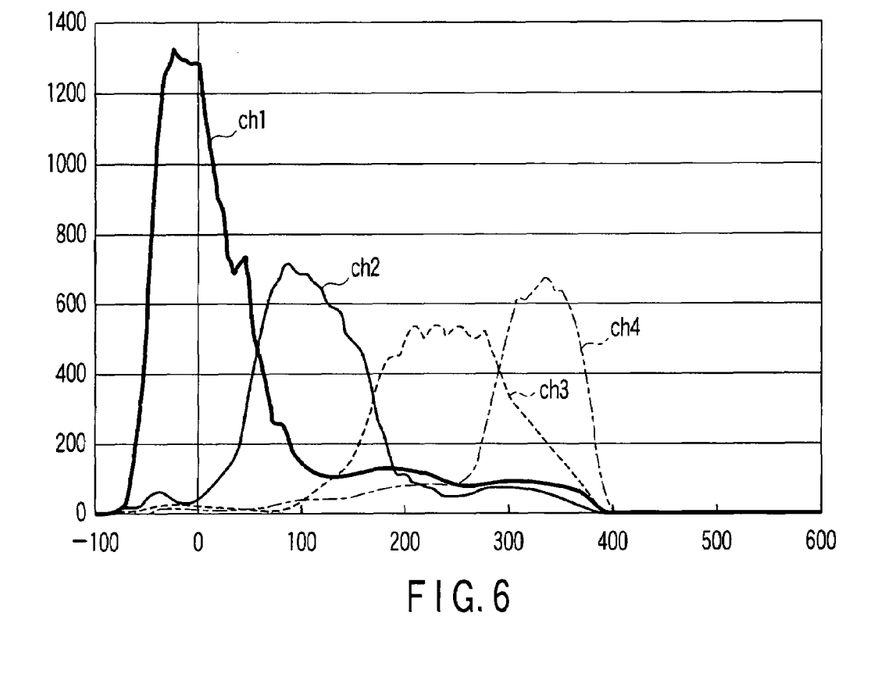
FIG. 6 is a diagram showing one example of the projection data obtained for four element coils contained in the RF coil units in FIG. 2.
Figure 7:
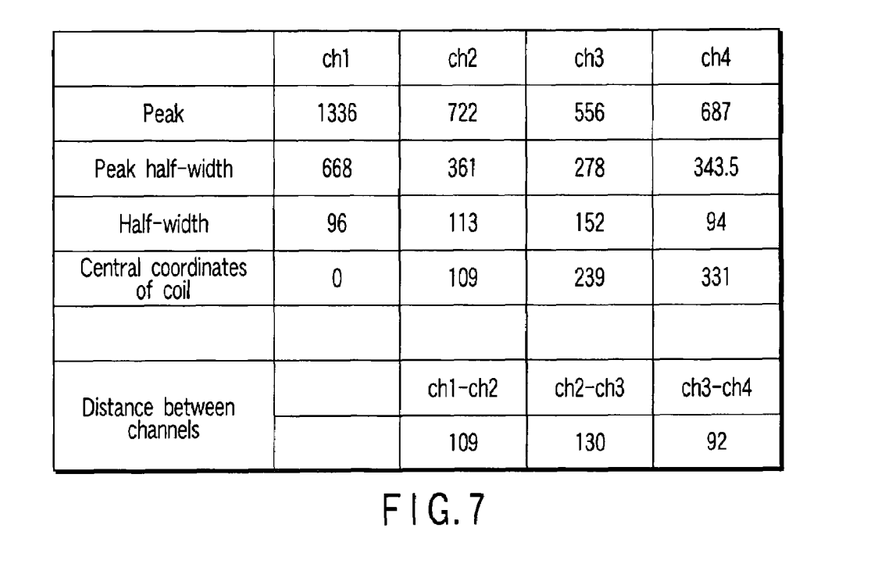
FIG. 7 is a diagram indicating various numerical values found from FIG. 6.

FIG. 6 is a diagram showing one example of the projection data obtained for the four element coils 61 in the RF coil unit 6b-4. It is to be noted that the distance between adjacent ones of the four element coils 61 is 120 mm. A normal, healthy person with a normal physique is adopted as the subject 200, and a pulse sequence shown in FIG. 4 is used, thereby obtaining the data by sagittal imaging (horizontal projection) with a thickness of 50 cm (substantially nonselective excitation). It is to be noted that the prevention of returning in a reading direction due to oversampled collection should naturally be exercised together.

The central coordinates estimated for the four element coils 61 on the basis of the projection data as described above are 0, 109, 239 and 331 mm with reference to the central coordinates of a first channel ch1. However, the centers of peak areas after the threshold processing of the projection data are regarded here as the estimated values of the central coordinates of the element coils 61. Here, the above-mentioned threshold processing is performed with the half-value width of the peak of the projection data.

The distances between the adjacent element coils 61 on the basis of the estimated values are 109, 130 and 92 mm, and do not coincide with known information of 120 mm. That is, the central positions estimated as described above can not precisely estimate the positions of the element coils 61. Thus, the main controller 17 determines the central coordinates of the four element coils 61 by the following calculations regarding coordinates (170 mm) obtained as an average value of the four central coordinates as reference coordinates on the basis of known information that the distance between the element coils 61 is 120 mm.

First channel ch1: 170−120×1.5=−10 mm
Second channel ch2: 170−120×0.5=110 mm
Third channel ch3: 170+120×0.5=230 mm
Fourth channel ch4: 170+120×1.5=350 mm Thus, the positions of the element coils 61 can be more precisely determined because the positions of the element coils 61 are determined on the basis of the relation among the central coordinates estimated for the respective element coils 61 and the known distance between the element coils 61. That is, more robust estimations can be made than when the position of each of the element coils 61 is independently found.

In addition, while the determination of the positions of the element coils 61 contained in the RF coil unit 6*b*-4 has only been described here, the position determination is similarly carried out for the other RF coil units 6*b*. However, for the plurality of RF coil units 6*b* linked to each other by the mechanical link mechanism, the positions of the element coils 61 contained therein can be collectively determined by the processing described above.

For example, assume that the RF coil units 6*b*-2 and 6*b*-3 are linked to each other so that the distance between the element coils 61 located at the ends of the respective RF coil units may be 120 mm. At this point, if, for example, the RF coil unit 6*b*-2 alone is within the imaging use zone 22 as shown in FIG. 2, it is not possible to obtain information for judging the positions of the element coils 61 contained in the RF coil unit 6*b*-3. However, if the central coordinates of the element coils 61 of the second to fourth channels ch2 to ch4 of the RF coil unit 6*b*-2 are estimated to be 118, −2 and −122 mm as described above, the central coordinates of the element coil 61 of the first channel ch1 of the RF coil unit 6*b*-2 can be determined to be 238 mm, and the central coordinates of the element coils 61 of the respective channels of the RF coil unit 6*b*-3 can be determined to be −242, −362, −482 and −602 mm.

Furthermore, for example, if the ends of the RF coil units 6*b*-2 and 6*b*-3 are only within the imaging use zone 22, the positions of the element coils 61 of the RF coil units 6*b*-2 and 6*b*-3 can be determined on the basis of the position estimated for at least one element coil 61 contained in the RF coil unit 6*b*-2 and the position estimated for at least one element coil 61 contained in the RF coil unit 6*b*-3.

When the number of element coils 61 contained in the RF coil units 6*b* with unfixed positions exceeds the number of reception channels provided in the receiver 9, it is impossible to collect the received signals of all the corresponding element coils 61 in the position determination pre-scan. In such a case, reception channels are allocated to the RF coil units 6*b* with unfixed positions. For example, if the number of channels capable of receiving in a system is 16 and the number of RF coil units 6*b* with unfixed positions is five, three channels can be allocated to each of the five RF coil units 6*b*.

The main controller 17 displays the positions of the element coils 61 determined as described above on a user interface for setting imaging conditions such as a scan plan. The schematic diagram, for example, as shown in FIG. 2 can be used for this display. This display may be performed only to let the operator check the positions of the element coils 61 or may be performed only to let the operator select the element coils 61 to be used for imaging.

When such display is performed, the operator can easily and accurately know the positions of the element coils 61.

It is to be noted that the positions of the element coils 61 are determined on the basis of information about the positions estimated from the received signals of the element coils and on the basis of known information (such as physical position information, the distance between the element coils, and the distance from the center of the coil unit to the center of coil element), and are therefore determined to be relative positions from the center of a static magnetic field. Thus, these positions may be converted to positions relative to the top board 41 when displayed.

(2) Setting of RF Power.

The position determination as described above should desirably be carried out at the earliest possible time in an inspection. In an MRI apparatus, in general, a region of interest is moved to the center of a magnetic field after the positioning of the subject 200 is completed, and a series of normal pre-scans for the adjustment of RF power and reception gains are performed. In the MRI apparatus 100, the position determination pre-scan is performed before the normal pre-scans. In this case, the main controller 17 sets the RF power in the position determination pre-scan to a value suitable for the weight of the subject 200 in accordance with the weight of the subject 200 input from the input unit 16 and a weight-by-weight RF table prepared in advance.

(3) Improvement of Robustness by the Prevention of Overflow.

Each of the subjects 200 has their own physique, and there are wide variations of the intensity of the magnetic resonance signals received by the element coils 61. Moreover, for example, the magnetic resonance signals tend to be scarce in thoracic parts including lung fields or in the lower limbs having almost no signal in a median part, and the intensity of the magnetic resonance signal received by the element coils 61 also changes depending on the imaging target. Taking such circumstances into account, the slicing thickness in the above-mentioned position determination pre-scan is set at 50 cm (substantially nonselective excitation) to ensure that the magnetic resonance signals useful for the position determination can be received. However, emitted magnetic resonance signals that are extremely high are not preferable because they cause overflow. Therefore, the level of the magnetic resonance signal to be used for the position determination may be properly adjusted by any one of the methods shown below.

(3-1) A proper reception gain corresponding to the weight of the subject 200 is set in accordance with the weight of the subject 200 input from the input unit 16 and a weight-by-weight reception gain table prepared in advance.

(3-2) The reception gain is changed to receive the magnetic resonance signals more than once, and the signal which does not cause any overflow is used out of the obtained signals.

(3-3) The slicing thickness is changed to receive the magnetic resonance signals more than once, and the signal which does not cause any overflow is used out of the obtained signals.

(3-4) The repetition time (TR) of the pulse sequence is changed to receive the magnetic resonance signals more than once, and the signal which does not cause any overflow is used out of the obtained signals.

(3-5) Pre-saturation pulses and inversion pulses are applied to the entire imaging region, and then data is collected for use in the position determination.

(3-6) A multiecho sequence with twisters is employed as a sequence of the position determination pre-scan.

It is to be noted that imaging conditions other than the slicing thickness and TR can be changed in the methods of (3-3) and (3-4).

Any one of these methods can be employed to properly adjust the level of the magnetic resonance signal to be used for the position determination. However, a reception error might occur if the input information on the weight of the subject 200 is not accurate in the method of (3-1), and collection time is longer in the methods of (3-2) to (3-4). Moreover, the method of (3-4) depends on a relaxation time $T_1$ regarding the subject 200, so that the strength of the received signal is not easily controlled.

As a consequence, the method of (3-6) is better than the other ones. Therefore, the method of (3-6) will be described in detail.

Figure 8:
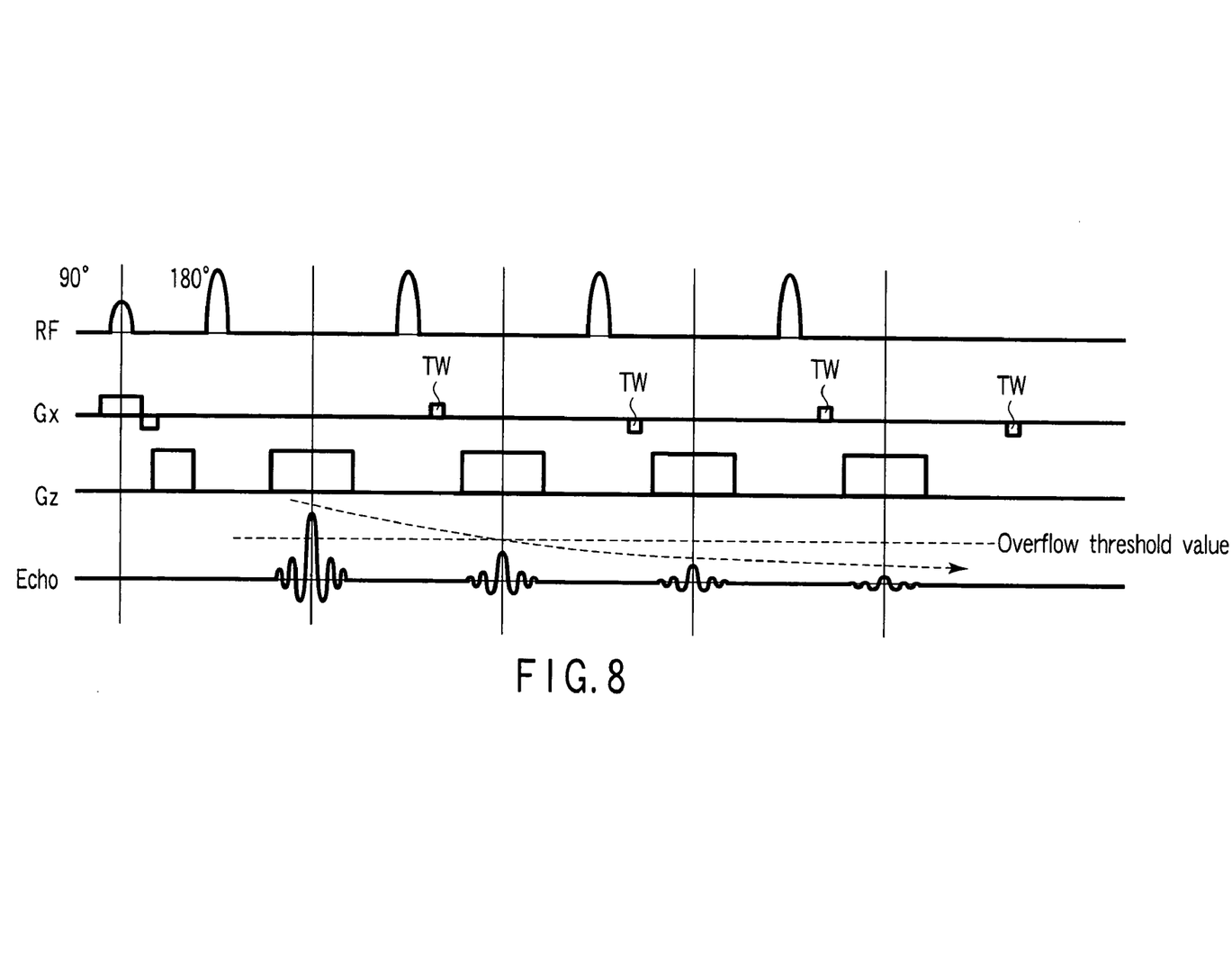
FIG. 8 is a timing diagram of a multiecho sequence with twisters.

FIG. 8 is a timing diagram of the multiecho sequence with twisters.

In this sequence, small twisters TW in a slicing direction are cumulatively applied. In a spin echo (SE) system, the signs of the twisters TW need to be alternately positive and negative. The size of the twister TW is set to be substantially equal to or less than the slicing thickness for one encoding even when cumulated to the amount of a multiecho (δ-encoded). Naturally, effects may be reset by a reverse pulse for each echo, and a desired amount of a spoiler may be applied at a next echo, instead of the cumulative application.

For example, γGTW=δ is satisfied, where W is the slicing thickness, G is the strength of the gradient magnetic field of the twister TW, and T is the application time. Thus, if δ=0.2, W=0.5 m and T=1 ms, $$\gamma G=0.2/((1/1000)\times(0.5))=400 \text{ Hz/m}$$

$$G=400/(43.6\times10^6)\cong10^{-5} \text{ T/m}=0.01 \text{ mT/m},$$

so that the twisters TW may be weak pulses. In spite of signal attenuation due to echo time (TE), the twisters TW ensure that the strength of the echoes can be decreased. Then, the main controller 17 uses the first echo smaller than a predetermined overflow threshold value for the position determination. For example, the second echo is employed in the example shown in FIG. 8.

Figure 9:
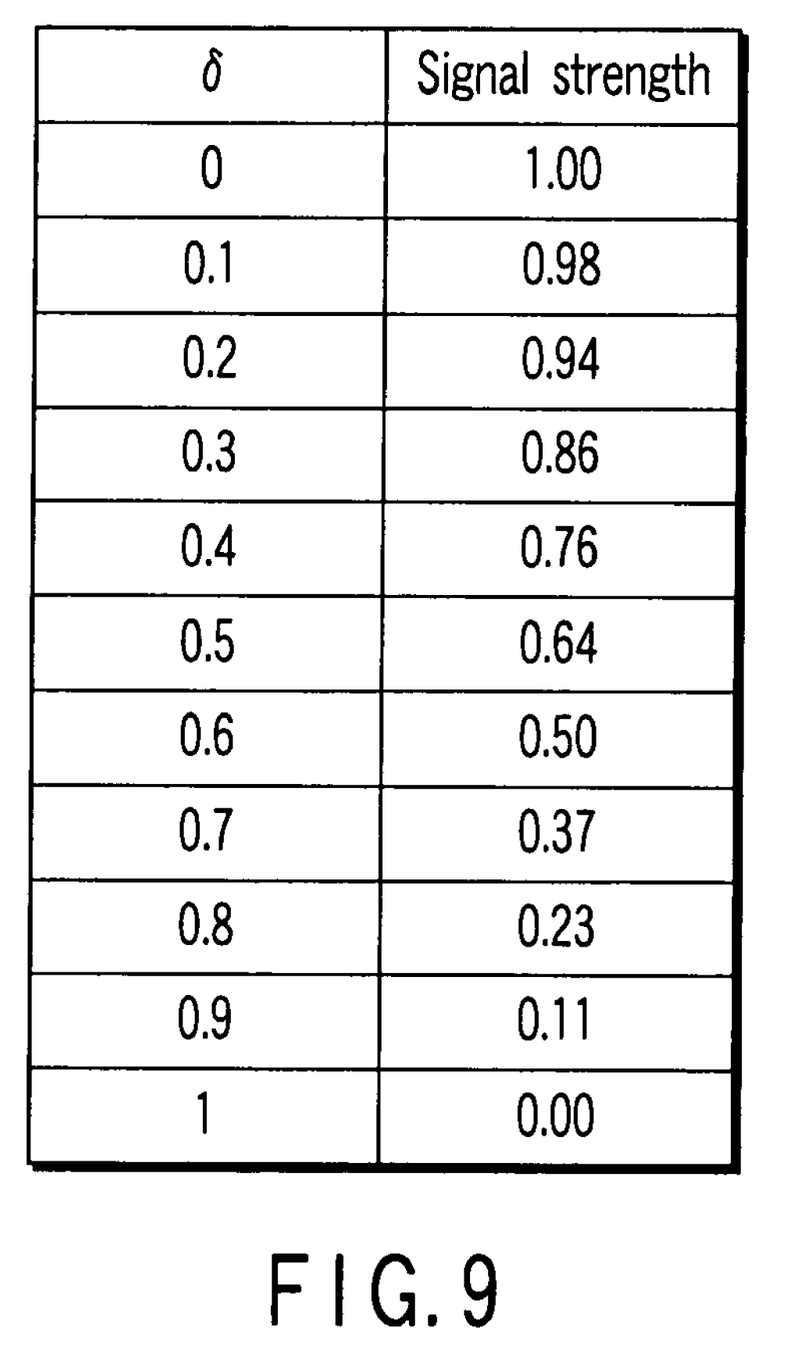
FIG. 9 is a diagram showing changes of relative signal amounts with respect to δ when the twisters are used.

In addition, when the twisters TW are used, a signal is attenuated in accordance with a Sinc function in the case of rough approximation where the structures of the subjects 200 are the same, so that a relative signal amount is changed (attenuated) with respect to δ as shown in FIG. 9.

The amounts of twisters as actual pulses can be 0, −0.5, 0.3 and −0.1 by giving a sign to the difference therebetween so that the cumulative twister amount may be, for example, 0, 0.5, 0.8 and 0.9.

Thus, the multiecho sequence can be used and there is therefore no need for repetitive excitation, so that the prolongation of the data collection time can be substantially neglected. For example, a sequence of TE=10 ms and four echoes makes it possible to complete the data collection in about 50 ms, which is significantly efficient.

In addition, since there can be a difference of signal strength among the MRI apparatuses, it is desirable to properly change the settings of the twister amount and the reception gain in consideration of the difference. However, even if there is a difference of signal strength, the strength of the received signal decreases due to the effects of the twisters TW and the effects of T2 relaxation and the overflow is reduced as the echoes go on, so that the difference of signal strength can be neglected.

Various modification of this embodiment can be made as follows:

(1) The position determination pre-scan can also be performed during the feeding of the top board after the subject 200 has been positioned at the start of an examination.

Figure 10:
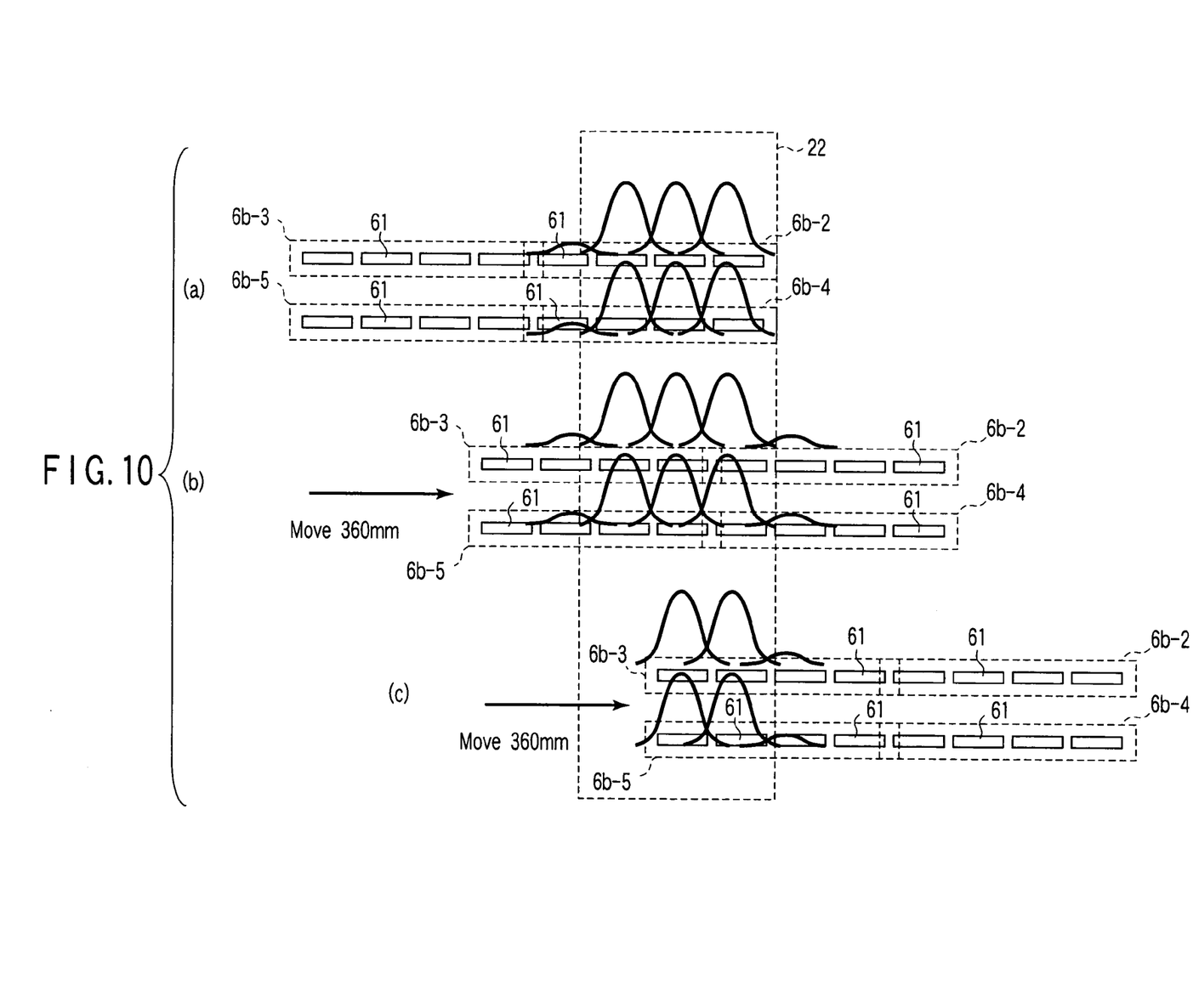
FIG. 10 is a diagram showing how the position determination pre-scan is performed during the feeding of a top board.

As a typical example of its realization, the RF power is set in accordance with the weight-by-weight RF table prepared in advance before the start of the feeding of the top board. The gain is minimized. Then, as shown in FIG. 10, the top board 41 is moved at about 18 cm/s so that data is collected using the above-mentioned multiecho sequence with twisters every 2 s, that is, every time the top board 41 is moved 360 mm. The movement of the top board 41 may be stopped every data collection, but the data collection can be performed without stopping the movement. However, when the data collection is performed without stopping the movement of the top board 41, the top board 41 moves about 9 mm even during the data collection, so that it is desirable to make a positional correction every echo.

Data for the position determination up to the first region of interest is ready when the top board 41 is inserted in the table 21. When it is desired to directly check the installation positions of the coils corresponding to the top of the head to the tips of the toes by true total body imaging, the top board 41 may be moved over the whole region to perform the data collection. The RF coil units 6b-2, 6b-3, 6b-4 and 6b-5 can collect the projection data for judging the positions of all the element coils 61 contained in the RF coil units 6b-2, 6b-3, 6b-4 and 6b-5 by scans under conditions of (a), (b) and (c) in FIG. 10. It is to be noted that FIG. 10 schematically shows, in parallel with the element coils 61, the projection data obtained on the basis of the magnetic resonance signals received by the element coils 61.

The main controller 17 always recognizes the position of the top board 41, and determines the positions of the element coils 61 on the basis of the positions of the element coils 61 determined by the above-mentioned position determination and on the basis of the position of the top board 41 when the scans are performed.

(2) The projection data is influenced by the sensitivity of the coils, and therefore has a substantially Gaussian shape. The position where the projection data is at the maximum value can be the estimated coordinates of the positions of the element coils 61. Alternatively, in order to increase the robustness, the threshold processing may be performed at, for example, about 20% of the maximum value so that the midpoint or center of gravity of a region equal to or more than the threshold value is the estimated coordinates. Alternatively, Gaussian fitting is performed, and resulting central coordinates can be the estimated coordinates. In another case, a function having single-peaked shape of this kind may be fitted.

(3) A gradient magnetic field generally has nonlinearity. Recently in particular, there has been a tendency to allow the nonlinearity of the gradient magnetic field to a certain degree in order to increase the slew rate of the gradient magnetic field, to increase the maximum strength of the gradient magnetic field or to provide trade-off for, for example, the increase in diameter. Thus, taking the nonlinearity in the Z-direction into account, data having a peak in a region located, for example, within ±15 cm of the center of the magnetic field may only be employed to determine the positions. In this case, if the position determination pre-scan is performed during the feeding of the top board as described above, the top board 41 may be moved 27 cm every 1.5 seconds to collect data. Naturally, the nonlinearity may be corrected and resulting data may be employed as the estimated data.

(4) Since an error is also produced in projection position information by the nonuniformity of the static magnetic field, a similar correction may be made. Here, the distortion of a position due to the nonuniformity of the static magnetic field depends on the strength and polarity of the gradient magnetic field for reading, so that these are taken into consideration.

(5) While the position determination along the Z-axis has only been described so far, it is also possible to determine, if any, the positions of the element coils 61 that are arranged in another direction such as on an X-Y surface perpendicular to the Z-axis. In this case, the reading direction in the position determination pre-scan may be adapted to the gradient magnetic field in the arrangement direction of the element coils 61. The position determination pre-scan may be repeated to determine the positions regarding more than one of the X-, Y- and Z-directions.

(6) The positions of the element coils 61 may be determined on the basis of the projection data alone without referring to the known information.

(7) The physical numerical value regarding the arrangement of the element coils 61 may be various other numerical values such as a numerical value indicating the size of the RF coil unit 6b and a numerical value indicating the size of the element coil 61, or may be a combination of these various numerical values.

(8) The known information on the arrangement of the element coils 61 is not limited to the physical numerical value, and may include other information such as information indicating the arrangement condition of the element coils 61.

(9) The positions of the RF coil units 6b may be determined.

(10) The projection data obtained with respect to part of the element coils 61 included in the RF coil unit 6b and the known information regarding the arrangement of the element coils 61 can be relined upon to determine the positions of the remaining part of the element coils 61. For example, assume that the central coordinates of the element coils 61 of the second and third channels ch2 and ch3 are determined to be 118 mm and −2 mm on the basis of the projection data regarding the first to third channels ch1 to ch3 of the RF coil unit 6b-2. In this case, the central coordinate of the element coil 61 of the fourth channel ch4 can be determined to be −122 mm.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) apparatus comprising:
    an array RF coil in which a plurality of element RF coils are arranged along an array axis to receive magnetic resonance signals from a subject;
    a calculation unit which calculates projection data for each of the element coils along said array axis based on magnetic resonance signals received by the plurality of element coils; and
    a determination unit which determines the positions of each of the plurality of element coils or the position of the array coil using the projection data for itself and others of the plurality of element coils.

2. The magnetic resonance imaging apparatus according to claim 1, wherein the magnetic resonance signals received by the plurality of element coils is received without moving said coils with respect to said MRI apparatus.

3. A magnetic resonance imaging apparatus comprising:
    an array coil in which a plurality of element coils are arranged to receive magnetic resonance signals from a subject;
    a calculation unit which calculates projection data for the element coils regarding an arrangement direction of the plurality of element coils on the basis of the plurality of magnetic resonance signals received by the plurality of element coils; and
    a determination unit which determines the positions of the plurality of element coils or the position of the array coil on the basis of the projection data for the plurality of element coils and known information regarding the arrangement of the plurality of element coils.

4. The magnetic resonance imaging apparatus according to claim 3, wherein
    the determination unit further comprises:
    an estimation unit which estimates the positions of the plurality of element coils on the basis of the projection data for the plurality of element coils; and
    a correction unit which corrects the estimated positions of the plurality of element coils on the basis of a physical numerical value regarding the arrangement of the plurality of element coils to determine the positions of the plurality of element coils or the position of the array coil.

5. The magnetic resonance imaging apparatus according to claim 4, wherein
    the estimation unit estimates a central position in the arrangement direction of the array coil on the basis of the estimated positions of the plurality of element coils, and
    the correction unit corrects the central position on the basis of the physical numerical value to determine the positions of the element coils.

6. The magnetic resonance imaging apparatus according to claim 4, wherein
    the estimation unit subjects the projection data for the plurality of element coils to threshold processing, and estimates the centers of the areas of the projection data subjected to threshold processing to be the positions of the plurality of element coils.

7. The magnetic resonance imaging apparatus according to claim 3 being configured to be used in a condition where the plurality of array coils are linked to each other, wherein the calculation unit calculates the projection data regarding the plurality of element coils contained in the plurality of array coils, and the determination unit determines the positions of the plurality of element coils contained in the plurality of array coils or the positions of the plurality of array coils on the basis of the projection data for the plurality of element coils and a linkage condition of the plurality of array coils.

8. The magnetic resonance imaging apparatus according to claim 3, wherein the calculation unit only calculates the projection data regarding the element coil which has received a magnetic resonance signal of strength equal to or less than specified strength.

9. The magnetic resonance imaging apparatus according to claim 3, wherein the determination unit only uses, for the determination, the projection data regarding the element coil which has received the magnetic resonance signal of strength equal to or less than the specified strength among the projection data for the plurality of element coils.

10. The magnetic resonance imaging apparatus according to claim 3, wherein at least one of the calculation unit and the determination unit does not use, for processing, data having a serious error due to the nonlinearity of a gradient magnetic field or the nonuniformity of a static magnetic field.

11. The magnetic resonance imaging apparatus according to claim 3, wherein the determination unit corrects a position determined on the basis of data having a serious error due to the nonlinearity of a gradient magnetic field or the nonuniformity of a static magnetic field, in consideration of the nonlinearity of the gradient magnetic field or the nonuniformity of the static magnetic field.

12. The magnetic resonance imaging apparatus according to claim 3, further comprising:

a unit which performs coil position confirmation display or coil position selection display on a user interface on the basis of the result of the determination by the determination unit.

13. A magnetic resonance imaging apparatus comprising:

an array coil in which a plurality of element coils are arranged to receive magnetic resonance signals from a subject;

a scan controller which applies gradient magnetic fields with twisters at different strengths in a multispin echo method, and, at the same time, performs a sequence of causing the plurality of element coils to receive the magnetic resonance signals under the application of the plurality of gradient magnetic fields at different strengths;

a calculation unit which calculates projection data regarding the plurality of element coils on the basis of a particular magnetic resonance signal among the plurality of magnetic resonance signals received under the application of the plurality of gradient magnetic fields; and a determination unit which determines the positions of each of the plurality of element coils or the position of the array coil on the basis of the projection data for itself and other of the plurality of element coils.

14. The magnetic resonance imaging apparatus according to claim 13, wherein the calculation unit specifies the magnetic resonance signal to be used for the calculation of the projection data out of the plurality of magnetic resonance signals by threshold processing.

15. The magnetic resonance imaging apparatus according to claim 13 being configured to be used in a condition where the plurality of array coils are linked to each other, wherein the calculation unit calculates the projection data regarding the plurality of element coils contained in the plurality of array coils, and the determination unit determines the positions of the plurality of element coils contained in the plurality of array coils or the positions of the plurality of array coils on the basis of the projection data for the plurality of element coils and a linkage condition of the plurality of array coils.

16. The magnetic resonance imaging apparatus according to claim 13, wherein the calculation unit only calculates the projection data regarding the element coil which has received a magnetic resonance signal of strength equal to or less than specified strength.

17. The magnetic resonance imaging apparatus according to claim 13, wherein the determination unit only uses, for the determination, the projection data regarding the element coil which has received the magnetic resonance signal of strength equal to or less than the specified strength among the projection data for the plurality of element coils.

18. The magnetic resonance imaging apparatus according to claim 13, wherein at least one of the calculation unit and the determination unit does not use, for processing, data having a serious error due to the nonlinearity of a gradient magnetic field or the nonuniformity of a static magnetic field.

19. The magnetic resonance imaging apparatus according to claim 13, wherein the determination unit corrects a position determined on the basis of data having a serious error due to the nonlinearity of a gradient magnetic field or the nonuniformity of a static magnetic field, in consideration of the nonlinearity of the gradient magnetic field or the nonuniformity of the static magnetic field.

20. The magnetic resonance imaging apparatus according to claim 13, further comprising:

a unit which performs coil position confirmation display or coil position selection display on a user interface on the basis of the result of the determination by the determination unit.

21. A magnetic resonance imaging apparatus comprising:

an array coil in which a plurality of element coils are arranged to receive magnetic resonance signals from a subject;

a movement unit which moves the subject or the array coil;

a scan controller which performs a sequence causing the plurality of element coils to receive magnetic resonance signals while moving the subject or the array coil by the movement unit;

a calculation unit which calculates projection data for the element coils regarding an arrangement direction of the plurality of element coils on the basis of the plurality of magnetic resonance signals received by the plurality of element coils; and a determination unit which determines the positions of each of the plurality of element coils or the position of the array coil on the basis of the projection data for itself and other of the plurality of element coils.

22. The magnetic resonance imaging apparatus according to claim 21 being configured to be used in a condition where the plurality of array coils are linked to each other, wherein the calculation unit calculates the projection data regarding the plurality of element coils contained in the plurality of array coils, and the determination unit determines the positions of the plurality of element coils contained in the plurality of array coils or the positions of the plurality of array coils on the basis of the projection data for the plurality of element coils and a linkage condition of the plurality of array coils.

23. The magnetic resonance imaging apparatus according to claim 21, wherein the calculation unit only calculates the projection data regarding the element coil which has received a magnetic resonance signal of strength equal to or less than specified strength.

24. The magnetic resonance imaging apparatus according to claim 21, wherein the determination unit only uses, for the determination, the projection data regarding the element coil which has received the magnetic resonance signal of strength equal to or less than the specified strength among the projection data for the plurality of element coils.

25. The magnetic resonance imaging apparatus according to claim 21, wherein the movement unit stops the movement of the subject or the array coil when the magnetic resonance signals are received, and moves the subject or the array coil in the intervals between the receptions of the magnetic resonance signals.

26. The magnetic resonance imaging apparatus according to claim 21, wherein the movement unit moves the subject or the array coil when the receptions of the magnetic resonance signals are performed.

27. The magnetic resonance imaging apparatus according to claim 21, wherein at least one of the calculation unit and the determination unit does not use, for processing, data having a serious error due to the nonlinearity of a gradient magnetic field or the nonuniformity of a static magnetic field.

28. The magnetic resonance imaging apparatus according to claim 21, wherein the determination unit corrects a position determined on the basis of data having a serious error due to the nonlinearity of a gradient magnetic field or the nonuniformity of a static magnetic field, in consideration of the nonlinearity of the gradient magnetic field or the nonuniformity of the static magnetic field.

29. The magnetic resonance imaging apparatus according to claim 21, further comprising:

a unit which performs coil position confirmation display or coil position selection display on a user interface on the basis of the result of the determination by the determination unit.

\* \* \* \* \*